US005593907A

United States Patent [19]

Anjum et al.

[11] Patent Number: 5,593,907

[45] Date of Patent: Jan. 14, 1997

[54] LARGE TILT ANGLE BORON IMPLANT METHODOLOGY FOR REDUCING SUBTHRESHOLD CURRENT IN NMOS INTEGRATED CIRCUIT DEVICES

[75] Inventors: Mohammed Anjum, Austin; Klaus H. Koop, Elgin; Maung H. Kyaw, Austin, all of Tex.

[73] Assignee: Advanced Micro Devices, Sunnyvale, Calif.

[21] Appl. No.: 400,609

[22] Filed: Mar. 8, 1995

[51] Int. Cl.$^{6}$ .................................................. H01L 21/265

[52] U.S. Cl. .................................................. 437/35; 437/44

[58] Field of Search .................................. 437/35, 44, 45, 437/69, 27, 29, 30, 912

[56] References Cited

U.S. PATENT DOCUMENTS

| | | | |
|---|---|---|---|
| 5,147,811 | 9/1992 | Sakagami | 437/35 |
| 5,158,903 | 10/1992 | Hori et al. | 437/35 |
| 5,218,221 | 6/1993 | Okumura | 257/336 |
| 5,308,780 | 5/1994 | Chou et al. | 437/35 |
| 5,320,974 | 6/1994 | Hori et al. | 437/35 |
| 5,360,749 | 11/1994 | Anjum et al. | 437/35 |
| 5,393,689 | 2/1995 | Pfiester et al. | 437/52 |
| 5,409,848 | 4/1995 | Han et al. | 437/35 |
| 5,413,945 | 5/1995 | Chien et al. | 437/35 |

*Primary Examiner*—Tom Thomas
*Assistant Examiner*—S. Mulpuri
*Attorney, Agent, or Firm*—Kevin L. Daffer; Conley, Rose & Tayon

[57] ABSTRACT

A semiconductor structure with large tile angle boron implant is provided for reducing threshold shifts or rolloff at the channel edges. By minimizing threshold shifts, short channel effects and subthreshold currents at or near the substrate surface are lessened. The semiconductor structure is prepared by implanting boron at a non-perpendicular into the juncture between the channel and the source/drain as well as the juncture between the field areas and the source/drain. Placement of boron into these critical regions replenishes segregating and redistributing threshold adjust implant species and channel stop implant species resulting from process temperature cycles. Using lighter boron ions allow for a lesser annealing temperature and thereby avoids the disadvantages of enhanced redistribution and diffusion caused by high temperature anneal.

3 Claims, 4 Drawing Sheets

LARGE TILT ANGLE BORON IMPLANT METHODOLOGY FOR REDUCING SUBTHRESHOLD CURRENT IN NMOS INTEGRATED CIRCUIT DEVICES

BACKGROUND OF THE INVENTION

1. Field of the Invention

This invention relates to integrated circuit fabrication and more particularly to NMOS integrated circuits having short channel lengths and a threshold adjust implant.

2. Description of the Relevant Art

Fabrication of an MOS device is well known. Generally speaking, MOS devices are manufactured by placing a polysilicon material over a relatively thin gate oxide, patterning the polysilicon material, and thereafter implanting the patterned polysilicon and adjacent source/drain regions with an impurity dopant material. If the impurity dopant material used for forming the source/drain regions is n-type, then the resulting MOS device is an NMOS device. Conversely, if the source/drain dopant material is p-type, then the resulting MOS device is a PMOS device.

Fabrication of an NMOS device begins with a p-type substrate having n-type source/drain regions implanted therein. A channel region is formed within an upper layer of the substrate between corresponding pairs of source and drain regions. A patterned gate oxide and polysilicon (polysilicon trace element) are pre-formed above the channel in order to controllably activate an inversion area within the channel between source and drain junctions. In FIG. 1, a top view of a generalized MOS device 10 is shown having a polysilicon trace element 12 placed above channel region 14. Channel region 14 is configured between source/drain implants 16.

Very large scale integration (VLSI) processing dictates that devices 10 be placed close to one another in a dense fashion. As such, source/drain regions 16 are implanted at a shallow depth, and are separated from one another by a short channel region 14. The distance between source/drain regions is often referred to as the "physical channel length". However, after implantation and subsequent diffusion of the source/drains, the distance between the source/drain regions 16 becomes less than the physical channel length, and is often referred to as the "effective channel length" (Leff).

Referring to a cross-sectional view along plane A—A of FIG. 1, FIG. 2 illustrates Leff as the distance between the inner diffusion boundaries of source/drain regions 16. As MOS devices become more dense, Leff becomes extremely small. A well-known phenomena, denoted as "short channel effects" (SCE) generally arises whenever Leff becomes less than approximately 2.0 μm. SCE becomes a dominant part of MOS device behavior at small Leffs. Generally speaking, SCE impacts device operation by, inter alia, reducing device threshold voltages and increasing subthreshold currents. A problem associated with SCE, however, altogether different in operation from SCE, is the problem of "hot carrier effect" (HCE). HCE is a phenomena by which hot carriers (i.e., holes or electrons) can overcome the potential energy barrier between the silicon and overlying silicon dioxide (i.e., gate oxide) in order to cause hot carriers to inject into the gate oxide. HCE thereby relates to carrier impact at the substrate topography, whereas SCE relates to carrier impact within the substrate itself.

SCE is most pronounced by its affect upon threshold voltages. As Leff is reduced, measured value of threshold voltage of an NMOS enhancement-mode device becomes less positive, while threshold of an NMOS depletion-mode device becomes more negative. Hence, some of the channel region becomes partially depleted without any influence of a gate voltage. Since some of the channel is depleted absence gate bias, less gate charge is required to invert the channel in short-channel devices than in long-channel devices with comparable substrate doping. Another problem associated with SCE is the impact upon subthreshold currents. In short-channel devices, larger subthreshold current values are observed at lower voltages than in long-channel devices. Two of the primary causes of increased subthreshold current are: (i) punchthrough and (ii) drain-induced barrier lowering (DIBL). Punchthrough results from the widening of the drain depletion region when a reverse-biased voltage is placed on the drain. The electric field of the drain may eventually penetrate to the source area, thereby reducing the potential energy barrier of the source-to-body junction. Recent studies have indicated that in devices which use ion implantation to adjust threshold voltages, the barrier is lowest away from the silicon-silicon dioxide interface. As a result, punchthrough current appears to flow below the surface region and deep within the substrate bulk material. Contrary to punchthrough current, DIBL-induced current seems to occur mostly at the substrate surface. Application of a drain voltage can cause the surface potential to be lowered, resulting in a lowered potential energy barrier at the surface and causing the subthreshold current in the channel near the silicon-silicon dioxide interface to be increased. This implies that subthreshold current at the surface due to DIBL is expected to become larger as the gate voltage approaches threshold.

As shown above, there are numerous effects resulting from SCE including but not limited to threshold, punchthrough and DIBL skews. Unlike SCE, HCE occurs above the substrate in the substrate topography and, more particularly, mostly in the gate oxide. This is because the gate oxide normally contains empty electron states, also known as "traps", which can be filled by the injection of hot carriers. Due to the polarity of trapped charge, the resulting shift in the NMOS device threshold is positive. The result of HCE is therefore the same as SCE for threshold skew, but the means for achieving the deleterious result is altogether different. Further, HCE does not demonstrate bulk or surface-induced current such as punchthrough-induced current and DIBL-induced current.

The problems associated with NMOS devices are unique and dissimilar from PMOS devices. NMOS devices generally suffer from HCE to a greater degree than PMOS devices. Channel lengths smaller than, for example, 1.5 μm make more severe the migration of hot carriers (i.e., electrons) to unwanted areas of the NMOS device. Hot electrons in NMOS devices are more mobile than hot holes in PMOS devices, making HCE a predominant problem in NMOS processing. A popular processing methodology used to minimize HCE is to apply double-diffused drains or lightly diffused drains (LDDs) in the active area. The purpose of LDDs is to absorb a majority of the electron potential into the drain and thus reduce the maximum electric field therein. Illustrated in FIG. 2 are LDDs 20 implanted into an active region 14 defined between field oxide areas 18. Field oxide 18 is selectively formed using, for example, the well-known local oxidation (often referred to as "LOCOS") process. Active regions are those regions which result from openings between locally oxidized field areas. A suitable field oxide insulation material includes silicon dioxide.

LDDs 20 are implanted into the active area after field oxide 18 and polysilicon 12 are formed, but before the formation of sidewall spacers 22. The purpose of sidewall spacers 22 at the sides of polysilicon element 12 is to ensure implant of source/drain 16 a spaced distance from the channel. Source/drain 16 are implanted at a higher dose than LDDs 20. Source/drain 16 implant species is preferably arsenic while LDD 20 implant species is preferably phosphorous. Lighter dose LDD implant absorbs virtually the entire voltage drop between the drain (or source) and the channel. The electric field is thereby reduced, resulting in a lessening of the hot carriers being injected into the gate oxide 24. As described in Ng, et al., "Suppression of Hot-Carrier Degradation in Si MOSFET's by Germanium Doping", *Electron Device Letters,* Vol. 11, No. 1, January, 1990, germanium co-implanted with the LDD areas further enhances the LDD structure. Germanium, being electrically neutral, is purposefully placed in the LDD areas in order to minimize injection of "lucky" hot carriers in the gate oxide.

A dissimilar phenomena from that of HCE and the LDD partial solution thereto, SCE often presents itself as punchthrough (bulk) current 26 and DIBL (surface) current 28 during subthreshold operations. In order to minimize punchthrough current along path 26, substantial research has focused upon using germanium co-implanted with the source/drain implant. See, e.g., Pfiester, et al., "Improved MOSFET Short Channel Device Using Germanium Implantation", *IEEE Electron Device Letters,* Vol. 9, No. 7, July, 1988. Germanium is therefore known as having an inhibiting effect upon junction depths, thereby providing reduced punchthrough current in the substrate bulk. More recent studies with fluorine indicates the retardant effect of fluorine upon both the junction depth as well as the lateral diffusion of the source/drain junction. See, e.g., Lin, et al., "The Effect of Fluorine on MOSFET Channel Length", *IEEE Electron Device Letters,* Vol. 14, No. 10, October, 1993.

While co-implant of a barrier material in the LDD appears to inhibit hot carrier injection and co-implant of the barrier material within the source/drain appears to inhibit subthreshold punchthrough current, additional solutions are needed, however, to inhibit DIBL-induced current along path 28. Dissimilar from the problems of HCE and punchthrough current, DIBL-induced current arises primarily from the operation of, or voltage placed upon, the drain region. A popular technique used to minimize DIBL-induced current typically involves placing a threshold adjust implant at the substrate surface in order to minimize DIBL-induced current therethrough. Boron is often lightly implanted at the substrate surface of an NMOS device, as shown by reference numeral 30, in order not only to increase threshold voltages in channel 14, but also to offset the lowering of the surface potential naturally resulting from drain bias. As the gate voltage approaches threshold, DIBL-induced subthreshold current will be lowered as a result of boron threshold adjust implant 30. Boron, being of relatively small atomic mass, as compared to, e.g., arsenic or phosphorous, is more mobile during processing steps subsequent to its implant. Movement of boron in region 30 from channel 14 to adjacent LDD 20 and/or source/drain 16 is often termed "boron redistribution and segregation". Many studies have evidenced this occurrence in NMOS device formation and have attributed its result to threshold rolloff and DIBL-induced current. See, e.g., Acovic, et al., "Arsenic Source and Drain Implant-Induced Degradation of Short-Channel Effects in NMOSFET's", *IEEE Electron Device Letters,* Vol. 14, No. 7, July, 1993.

As a result of recent discoveries, the advantages of boron implant 30 necessary to minimize DIBL-induced current are offset by boron migration from channel 14 and the problems resulting therefrom. While arsenic provides higher conductivity in the active source/drain areas 16, it also disrupts or damages the substrate lattice to a greater extent than lower atomic mass n-type implants such as phosphorous. In order to remove the damage caused by arsenic implant, higher temperature anneal at approximately 900° C. to 1100° C. is oftentimes necessary. In the course of annealing, boron atoms 32, shown in FIG. 3 (i.e., FIG. 3 being a detailed view along area C of FIG. 2), migrate or diffuse (segregate) from the edges of channel region 14 to LDD 20 and/or source/drain 16. The boron atoms can diffuse across substitutional (or vacant) sites or through interstitial movement. Vacancies in regions 20 and 16 caused by phosphorous atom 33 (in LDD region) and arsenic atom 34 (in source/drain region) implant brings about a large amount of intra-lattice disruptions at the implant site. Those disruptions greatly enhance interstitialcy and/or substitutional motion of lighter atomic species, such as the boron threshold adjust implant species, from edge of channel 14 to adjacent LDD regions 20 and source/drain regions 16.

While it is important to incorporate a threshold adjust implant step during NMOS processing using, for example, boron implant 30, it is also important to minimize the segregation and redistribution of boron atoms 32 within implant region 30 from channel 14 to adjacent source/drain region 16 and/or LDD region 20. One way in which to minimize boron redistribution and segregation is to implant an electrically inactive barrier atom along with the LDD implant or source/drain implant. By co-implanting an electrically inactive ion such as germanium, as described above, the barrier material effectively "plugs" redistribution avenues through which the migratory boron atoms 32 might take. For the same reason that germanium is an effective barrier species due to its large atomic mass, germanium unfortunately exacerbates the redistribution problems as a result of its implant. During implant, large germanium ions adds lattice disruption within the silicon substrate as a result of germanium nuclear collisions with the silicon target. The nuclear collision of large germanium ions displaces the target silicon atoms causing disorder within the substrate lattice. A prevalent amount of "sink" areas of boron bonding opportunities are thereby created in the source/drain 16 and/or LDD 20 regions as a result of the germanium ion impact.

Using a large atomic mass barrier dopant species adds an unacceptable amount of lattice disruption in the source/drain region 16 and LDD region 20. Instead of minimizing segregation and redistribution of boron from channel 14, additional lattice disruption caused by barrier implant has, in effect, an adverse boron distribution affect. If boron is allowed to redistribute to implant-damaged areas, redistributed boron would, instead of minimizing the problem of subthreshold (DIBL-induced) current, compound the problem. The result of enhanced redistribution would be a threshold rolloff at the edges of channel 14.

Related to but in many instances different from the SCE phenomenon is another phenomenon known as "narrow gate-width effect" (NGWE). NGWE refers to the encroachment of channel stop dopant such as boron under the field oxide 18 at the sides of active region 14. Referring to FIG. 4, a cross-sectional view of the gate width along plane B—B of FIG. 1 is shown. Channel stop dopant 36 is typically placed across the upper surface of the substrate below field oxide 18. Channel stop dopant 36 is of opposite polarity type than the source/drain regions and, for NMOS devices, is generally boron. Boron of channel stop dopant 36 is placed during or separate from the boron implanted within threshold adjust region 30. Channel stop dopant 36 is placed in most conventional processing steps prior to growth of field oxide 18. Channel stop dopant 36 thereby serves to adjust the threshold voltage in the field regions to prevent what is commonly referred to as "field inversion". Increase in device density results in a shortening of channel lengths as well as channel widths. As channel widths decrease, there appears a greater likelihood that source/drain voltages and channel voltage will cause field-induced encroachment of dopants 36 into the adjacent channel 14. Encroachment, shown by arrow 40 provides an even smaller channel width, i.e., a channel width, Wmod, which is less than the physical channel width, W. Encroachment appears a natural, yet unwanted result of boron segregation and redistribution from the field areas underneath field oxide 18 to channel areas 14.

A combination of out-migration of boron from channel 14 to source/drain 18 and in-migration of boron from field areas to channel 14 leaves a boron concentration skew or gradient across channel 14. Out-migration of boron from channel 14 as a result of the "sink" locations within the implanted source/drain regions is illustrated in reference to FIG. 5*a*. FIG. 5*a* exemplifies a threshold gradient across a channel length (L). At both edges of the channel length (L=0 and $L=L_{max}$), boron concentration is lessened as a result of out-migration causing a lowering of threshold (i.e., rolloff) at two opposing first pair of channel edges. FIG. 5*b* exemplifies a threshold gradient across a channel width (W). At both edges of the channel length (W=0 and $W=W_{max}$), boron concentration is heightened as a result of in-migration causing an increase in threshold at two opposing second pair of channel edges. The in-migration of boron and heightening of threshold along the second pair of channel edges appears as not being as critical a problem in short channel devices as boron out-migration and threshold rolloff. In the former instance shown in FIG. 5*a*, lessening of threshold occurs at the edges of the channel region, whereas, in the latter instance shown in FIG. 5*b*, lessening of threshold occurs in the edges of the field region underneath field oxide 18. Lessening of threshold in the channel may cause inadvertent turn-on or cause large subthreshold currents of the DIBL variety, and lessening of threshold in the field may cause inadequate electrical isolation and field inversion which in some instances can be compensated for by a thicker field oxide.

SUMMARY OF THE INVENTION

The problems outlined above are in large part solved by the improved NMOS processing methodology of the present invention. That is, an electrically active implant of boron ions are placed beneath the edges of the channel region to offset out-migration of boron therefrom. Boron ions can further be implanted beneath the edges of the field oxide to offset out-migration of boron therefrom. Thus, boron implant is used to replace boron loss due to out-migration or redistribution.

Boron implant into out-migration areas is performed at a non-perpendicular angle relative to the upper substrate surface. Boron is thereby implanted using a "large tile angle" (LTA) implant methodology, whereby the angle of incidence of the injected boron ions is at a non-perpendicular angle greater than 10 but less than 90 relative to the upper surface of the semiconductor substrate. LTA boron implant is carried out by injecting boron at an angle sufficient to place boron ions into the channel region, at the edges of the channel beneath corresponding edges of polysilicon/gate oxide. LTA boron implant is therefore used to place a set of boron ions inside the channel area adjacent the inner bounds of source/drain region and LDD region—i.e., between the midline of the channel region and the inner bounds of arsenic and phosphorous implanted regions.

Depending upon the height of the polysilicon element and the implant angle, varying amounts of electrically active boron ions are introduced at the edges of the channel and the edges of the field region beneath the edges of gate oxide and field oxide, respectively. Accordingly, LTA implant of boron serves a dual purpose of minimizing both SCE and NGWE. By implanting the electrically active boron species slightly underneath the gate oxide and field oxide and within the threshold adjust and channel stop regions, the implant compensates for boron redistribution from those regions.

LTA boron implant does not introduce significant amounts of lattice disruption as in the case of large mass, conventional barrier species. Boron, as an atomic species, is somewhat small in mass and avoids conventional problems often associated with implanting larger atomic mass barrier ions, such as germanium or indium. LTA boron implant is thereby used to effectively minimize DIBL-induced subthreshold currents (i.e., reduce threshold rolloff at the channel edges), and to minimize possible field inversion at the field edges (i.e., minimize segregation and redistribution resulting from NGWE). Thus, instead of obviating the above advantages through use of a conventional large atomic mass barrier implant, the present LTA boron implant can advantageously maintain the above advantages by keeping the boron concentration status quo in the critical threshold adjust areas.

Broadly speaking, the present invention contemplates a method for fabricating an integrated circuit. The method includes the steps of providing an opening to an active region of a semiconductor substrate upper surface. Boron ions are thereafter implanted at an angle substantially perpendicular (i.e., 90° or 90°±7°) to the semiconductor substrate upper surface through the opening and into the active region. A polysilicon trace element can then be patterned upon a portion of the active region, and boron ions are thereafter implanted at a non-perpendicular angle (greater than 7° but less than 83° relative to the substrate upper surface) through the opening and into the active region. The boron ions implanted at a perpendicular angle are preferably implanted to a concentration peak density at a first depth below the semiconductor substrate upper surface. The boron ions which are implanted at a non-perpendicular angle are preferably implanted to a concentration peak density at a second depth below the semiconductor substrate upper surface. According to one aspect of the present invention, the first depth is greater than the second depth.

The present invention further contemplates a method for reducing DIBL-induced currents by offsetting diffusion and segregation of boron from a channel region and from a field region to adjacent source and drain regions. The method includes the steps of providing boron into a field region. The field region is a portion of a semiconductor substrate residing below a patterned insulation material. Boron can also be provided into a channel region laterally spaced from the field region. The channel region resides within the substrate below a patterned polysilicon trace element. Boron ions can thereafter be implanted into a portion of the channel region and a portion of the field region at a non-perpendicular angle relative to the semiconductor substrate. A set of the implanted boron ions reside at a first concentration peak density within the channel region and the field region. Arsenic ions can thereafter be implanted into a source/drain region. The implanted arsenic ions reside at a second concentration peak density between the field region and the channel region.

BRIEF DESCRIPTION OF THE DRAWINGS

Other objects and advantages of the invention will become apparent upon reading the following detailed description and upon reference to the accompanying drawings in which.

Figure 1:
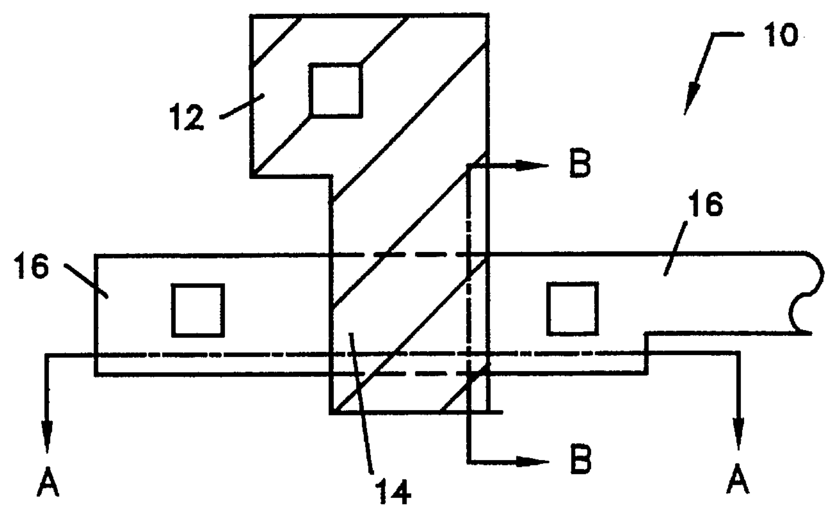
FIG. 1 is a top plan view of an MOS semiconductor device layout.
Figure 2:
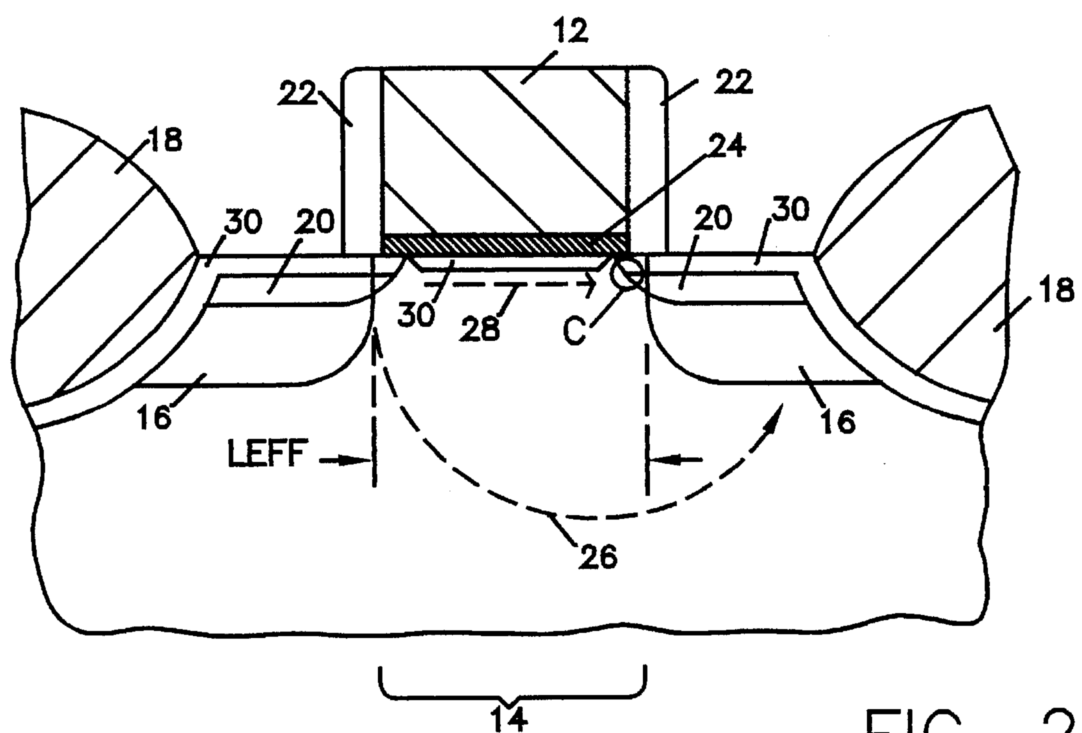
FIG. 2 is a cross-sectional view along plane A—A of FIG. 1, showing the semiconductor device partially formed according to a prior process methodology.
Figure 3:
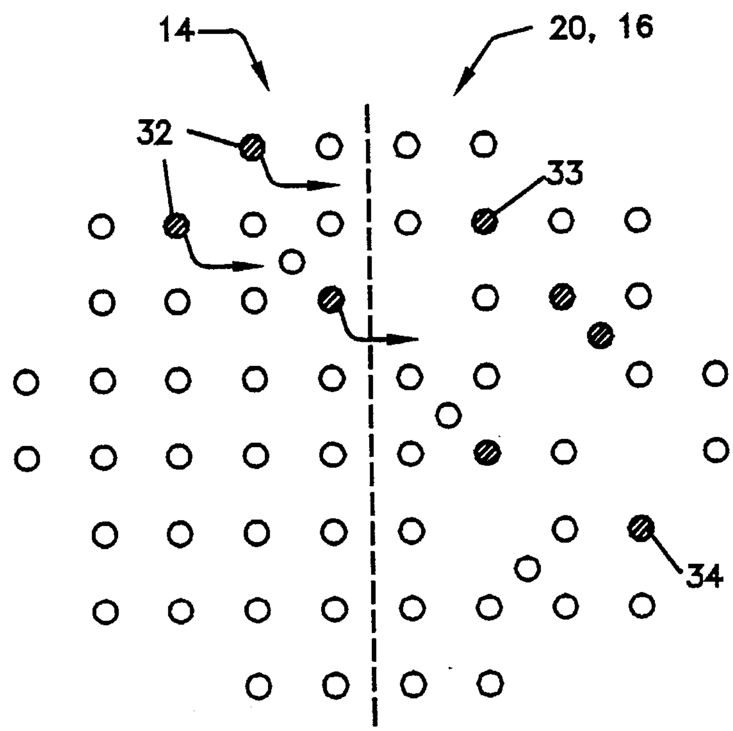
FIG. 3 is an atomic view along area C of FIG. 2, showing the substrate lattice structure at the channel-source/drain interface resulting from a prior process methodology.
Figure 4:
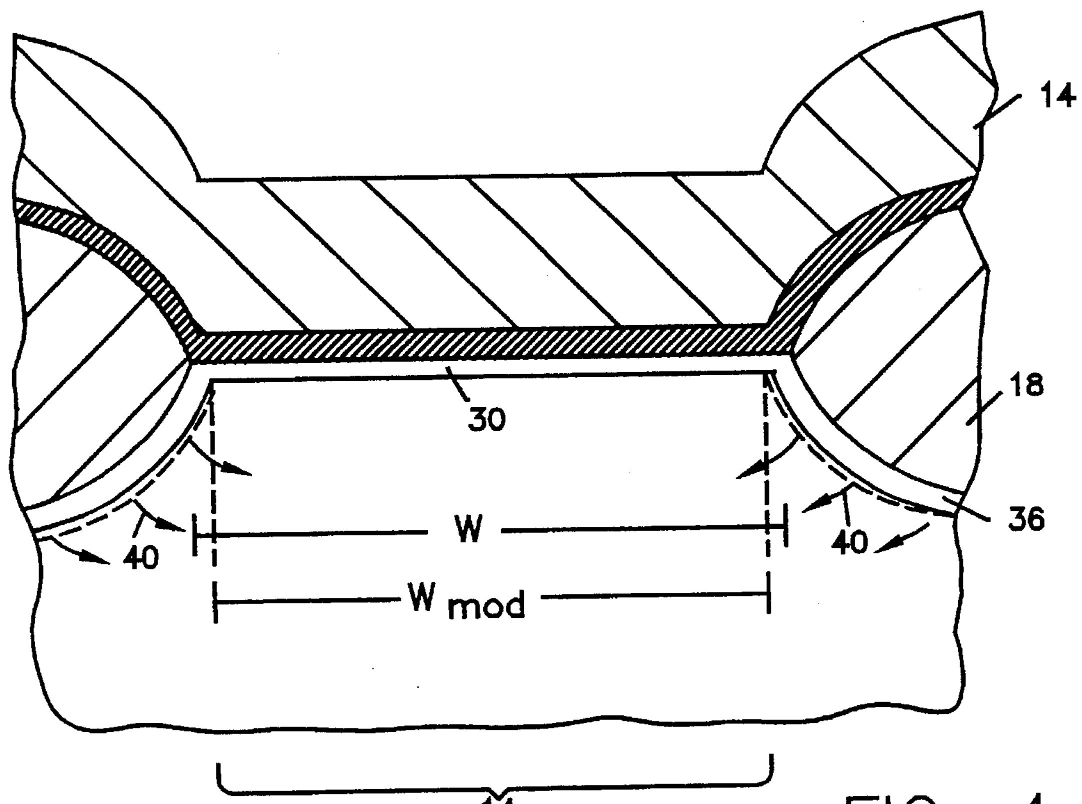
FIG. 4 is a cross-sectional view along plane B—B of FIG. 1, showing a semiconductor device formed according to a prior process methodology.
Figure 5A:
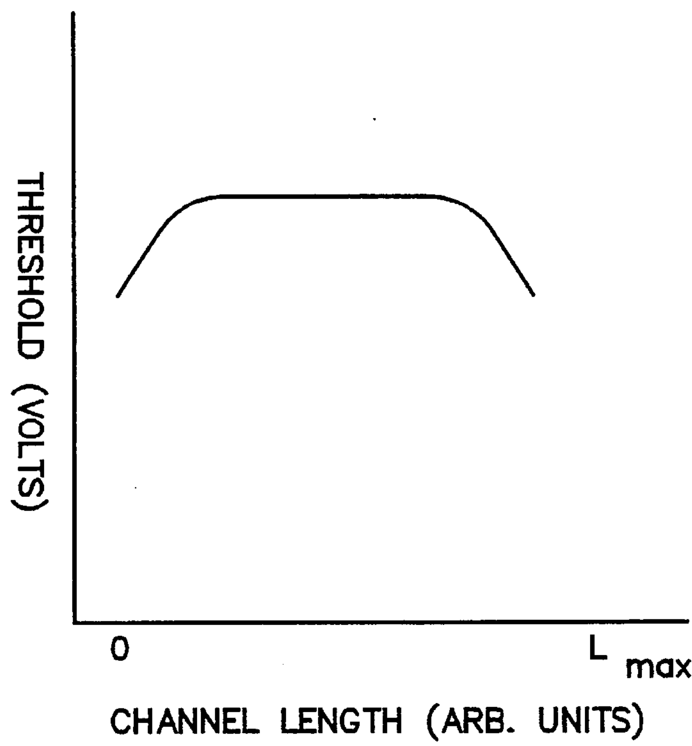
Figure 5B:
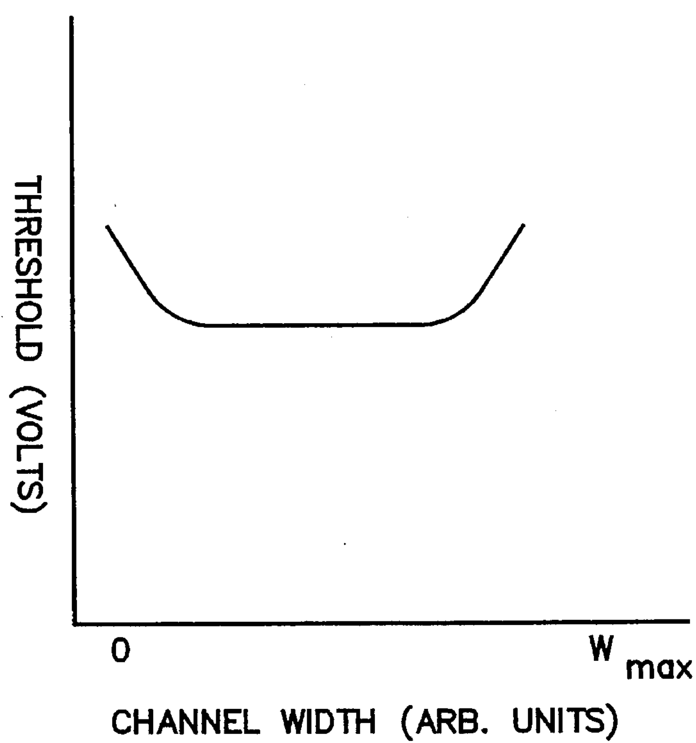
Figure 6:
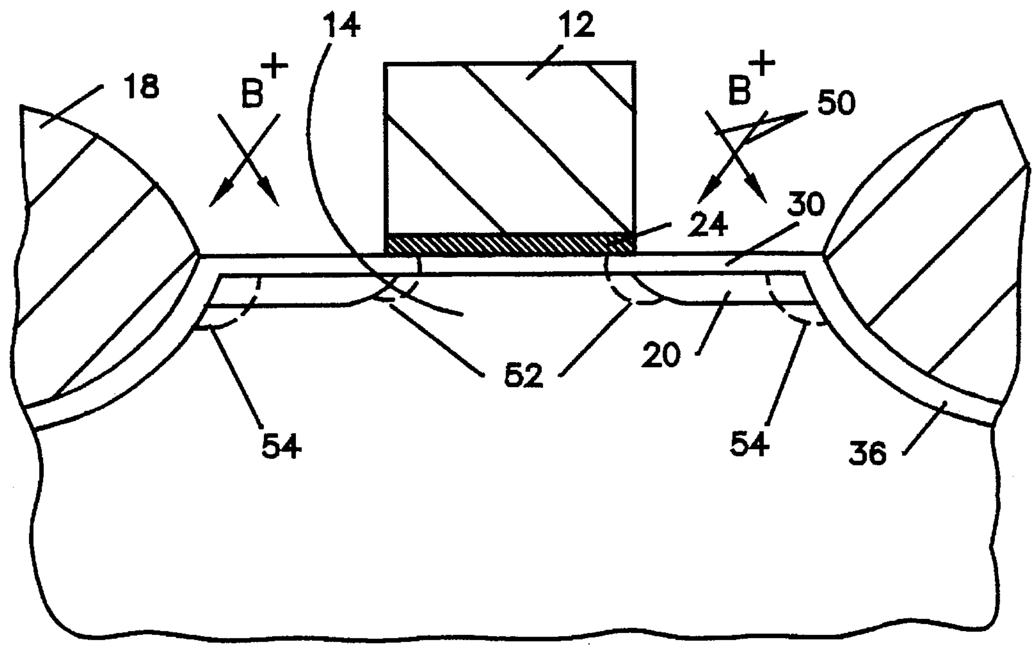
Figure 7:
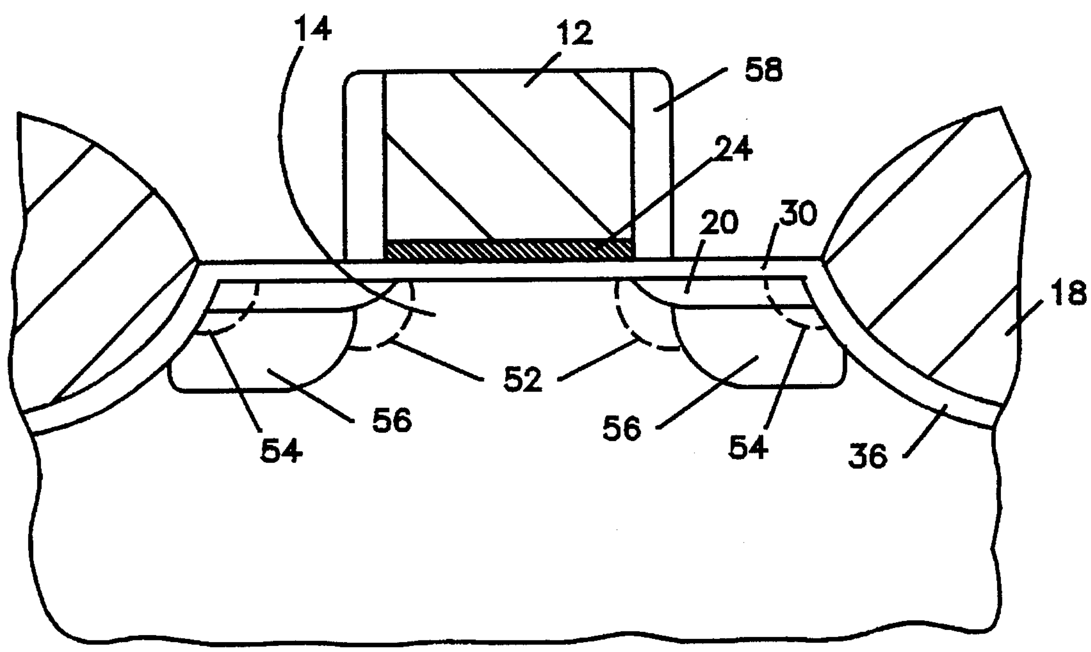

FIGS. *5a* and *5b* are graphs of normalized, estimated threshold voltage plotted as a function of channel length and width, respectively, of an NMOS device formed according to a prior process methodology;

FIG. 6 is a cross-sectional view along plane A—A of FIG. 1, showing a semiconductor device formed according to processing steps of the present invention; and FIG. 7 is a cross-sectional view along plane A—A of FIG. 1, showing a semiconductor device formed according to further processing steps of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 6, a cross-sectional view along plane A—A of FIG. 1 is shown fabricated according to processing steps hereof. In particular, FIG. 6 illustrates a step for LTA implant of boron according to the angle of incidence shown by reference numeral 50. According to a preferred embodiment, LTA implant is carried out at a step subsequent to LDD 20 formation. As described above, LDD 20 is implanted using the self-aligned process after threshold adjust implant 30 and channel stop implant 36 are placed. Implants 30 and 36, in NMOS processing, are p-type species, preferably boron. Implants 30 and 36 are used for reasons stated and fully described above.

LTA boron implant 50 is preferably performed immediately after LDD implant 20. Boron atoms from LTA boron implant 50 are placed at implant sites within the substrate, referenced by channel regions 52 and field oxide regions 54. Channel regions 52 exist at the edge of channel 14 (i.e., between the middle of channel 14 and LDDs 20). Preferably, channel regions 52 extend approximately 0.1 m to 0.5 m inside the outer edge of channel 14, inside and below the outer edge of polysilicon 12 and gate oxide 24. The amount of extension of regions 52 into channel 14 depends upon the angle of implant 50 and the height of adjacent topological features. A 0.2 m to 0.4 m implant inside the outer edge is a preferred range for devices of, for example 1.0 to 2.0 m channel length.

LTA boron implant provides replacement of boron out-migrating from channel 14 to adjacent source/drain regions. It is believed that the threshold rolloff and out-migration predominately occurs between 0.2 m to 0.4 m at the edges of channel 14. Replacement in those critical areas by LTA boron implant 50 advantageously replenishes boron density and maintains a substantially uniform threshold across the entire channel width. Replenishment is needed in those critical areas to offset boron out-migration normally occurring during the anneal step.

Use of LTA boron implant as a means for replenishing out-migrating boron is thereby contemplated as an advantage over conventional barrier implants. Barrier implants are generally not placed according to LTA techniques, and are generally performed using larger atomic mass species such as germanium or indium. LTA boron implant 50, being of smaller atomic mass, produces during implant what is believed to be simple isolated point defects within the lattice with minimal secondary displacements. At higher energies, LTA boron implants might conceivably produce defect clusters resulting from the primary beam ion. Energetic recoil within the lattice structure as a result of the primary beam ion may produce additional lattice displacements. The displacements caused by the above mechanism is well documented and generally described as "Frenkel defects".

The disordered regions caused by point defects, secondary displacements and defect clusters may, in the extreme, present local zones of completely amorphous material. However, it is unlikely that the relatively small mass associated with boron would produce such an effect. Most likely, boron implant would not cause an amorphous zones or clusters to appear. It is believed that only large ions (ions having atomic mass of greater than, for example, 30 a.m.u.) would, when implant, cause such an extreme dislocation pattern. It is postulated that LTA boron implants produce, in essence, only primary crystalline-defect damage and that LTA boron implants do not produce a continuous amorphous layer or clusters of continuous amorphous material in the silicon target.

The mechanics of primary crystalline-defects arise as a result of implanted boron ions causing a trail of slightly separated primary recoiled silicon atoms in the wake of the implanted boron ion. The recoil energy instituted by boron ions displace silicon atoms a relatively short distance. Short separation distance suggest that only a relatively small input of energy to the lattice could cause rejoinder of the separated silicon pairs. In fact, a large percentage of the disorder caused by LTA boron implant can be dynamically annealed during the implantation process. Thus, it is believed that primary crystalline-defects caused by even high-dose LTA boron implant can be dynamically annealed at or slightly above room temperatures.

Heavy ion implant, on the other hand, can cause significant damage to the lattice structure. In many instances, germanium implant produces large amorphous regions or a continuous amorphous layer in the silicon lattice. Lattice disruption from heavy ions is predominately due to nuclear collisions experienced by the decelerating heavy ions. Even a light dose of heavy ions appears capable of producing an exorbitant amount of damage to the lattice. Heavy ions such as arsenic or germanium can displace silicon atoms to such an extent that the displaced silicon atoms per unit volume approach the atomic density of the silicon substrate—i.e., the implanted region becomes amorphous. As the number of stably displaced silicon atoms reaches or exceeds the number of silicon atoms per unit volume, the displaced silicon atoms are less prone to rejoin into its prior crystalline orientation. The large amounts of disruption caused by heavy ions must be annealed at significantly higher temperatures than those used to anneal damage from substrates having, for example, primary crystalline-defects.

Annealing damage from amorphous layers is considerably more difficult that annealing damage caused by primary crystalline-defects. First, anneal temperatures necessary to remove damage within amorphous layers is much higher than temperatures necessary to remove primary crystalline damage. Anneal temperatures necessary to remove amorphous layers must exceed 800° C., and in many instances, must exceed 1000° C. Second, whenever high temperature anneal is used, a greater likelihood arises that implanted species will segregate or migrate from their implanted positions. Thus, high temperature anneal could migrate boron causing out-migrations problems stated above. Further, high temperature anneal could increase the junction depth of the source/drain regions beyond an acceptable limit. Thus, it is important to utilize an LTA implant which replaces out-migrating boron at select regions and which does not increase lattice disruption during the LTA implant process.

Turning now to FIG. 7, a processing step subsequent to the step of FIG. 6 is shown. In particular, FIG. 7 illustrates, subsequent to region 52 and 54 LTA implants, respectively, a source/drain implant into regions 56. Source/regions 56 are implanted after a spacer 58 is formed at the sidewall surfaces of polysilicon 12 and gate oxide 24. A suitable source/drain implant species for NMOS processing includes arsenic. While arsenic is of larger atomic mass than, for example, boron, arsenic implant and the crystalline damage associated therewith is spaced away from channel region 14 as a result of the self-aligned implant between spacer 58 and field oxide 18. Thus, the damage associated with arsenic implant, while substantial, does not directly hinder the critical edges of channel 14. As a result, the primary defect at the edge of channel 14 arises from lighter ion phosphorous implant into LDD region 30 and even lighter LTA boron implant shown in FIG. 6. By minimizing lattice disruption at the edge of channel 14, out-migrating boron from the threshold adjust region is minimized.

It is important to note that LTA implant of boron at angle of incidence shown as reference numeral 50 substantially reduces subthreshold current and, more particularly, reduces DIBL-induced currents. LTA boron implant reduces subthreshold currents by minimizing threshold reduction or rolloff at the edges of the channel. LTA boron implant therefore minimizes SCE. LTA boron implant, however, is not necessarily used as a solution to other problems such as HCE, or punchthrough currents associated with SCE. Moreover, LTA boron implant not only reduces DIBL-induced current, but also minimizes NGWE at the field oxide interface.

It will be appreciated to those skilled in the art having the benefit of this disclosure that this invention is capable of applications with numerous types of NMOS-processed circuits. Furthermore, it is to be understood that the form of the invention shown and described is to be taken as a presently preferred embodiment. Various modifications and changes may be made to each and every processing step as would be obvious to a person skilled in the art. Boron implant at a non-perpendicular angle at various interface regions of the active area can occur in the presence of or absence of a sidewall spacer (or LDDs). Thus, LDD technology is not required in order to carry forth the LTA boron implant hereof. It is intended that the following claims be interpreted to embrace all such modifications and changes and, accordingly, the specification and drawings are to be regarded in an illustrative rather than a restricted sense.

What is claimed is:

1. A method for replenishing diffusion and segregation of boron from a channel region and from a field oxide region to adjacent source and drain regions in order to reduce drain induced barrier lowering currents, the method comprising the steps of:

implanting boron ions into a field oxide region, wherein the field oxide region is a portion of a semiconductor substrate residing below a field oxide;

implanting boron ions into a channel region laterally spaced from said field oxide region, wherein said channel region resides within said substrate below a patterned polysilicon trace element;

implanting boron ions into a portion of said channel region and said field oxide region at a non-perpendicular angle relative to said semiconductor substrate to reduce drain-induced barrier lowering currents, wherein a first concentration peak density of a set of the non-perpendicularly placed said implanted boron ions reside at a first depth within said channel region and said field oxide region; and implanting arsenic ions into a source and drain region, wherein a second concentration peak density of said implanted arsenic ions reside at a second depth, and wherein the source and drain region resides between said field oxide region and said channel region.

2. The method as recited in claim 1, wherein said first depth is shallower in relation to an upper surface of said semiconductor substrate than said second depth.

3. The method as recited in claim 1, wherein said field oxide comprises silicon dioxide.

* * * * *